(12) United States Patent  
Briskin et al.

(10) Patent No.: US 7,075,373 B2
(45) Date of Patent: Jul. 11, 2006

(54) OVERCURRENT PROTECTION CIRCUIT WITH FAST CURRENT LIMITING CONTROL

(75) Inventors: Boris Briskin, Ankeny, IA (US); William A. Burkland, Huxley, IA (US)

(73) Assignee: Micrel, Inc., San Jose, CA (US)

( * ) Notice: Subject to any disclaimer, the term of this patent is extended or adjusted under 35 U.S.C. 154(b) by 71 days.

(21) Appl. No.: 10/980,071

(22) Filed: Nov. 2, 2004

(65) Prior Publication Data

US 2006/0091961 A1   May 4, 2006

(51) Int. Cl.
*H03F 1/52* (2006.01)
(52) U.S. Cl. .................................. 330/298; 330/207 P
(58) Field of Classification Search ................ 330/298, 330/207 P; 455/115, 117
See application file for complete search history.

(56) References Cited

U.S. PATENT DOCUMENTS

| 5,485,341 | A | 1/1996 | Okado et al. |
| 5,675,268 | A | 10/1997 | Petty et al. |
| 5,892,665 | A | 4/1999 | Matsumoto et al. |
| 5,903,422 | A | 5/1999 | Hosokawa |
| 6,304,108 | B1 * | 10/2001 | Inn .............................. 327/72 |
| 6,801,058 | B1 | 10/2004 | Jiandong |
| 6,801,419 | B1 | 10/2004 | Fukui |
| 2005/0184809 | A1 * | 8/2005 | Can et al. .................... 330/298 |

* cited by examiner

*Primary Examiner*—Robert Pascal
*Assistant Examiner*—Hieu Nguyen
(74) *Attorney, Agent, or Firm*—Patent Law Group LLP; Carmen C. Cook (57) ABSTRACT

An overcurrent protection circuit for a power transistor includes a transconductance amplifier and a bias current circuit. The transconductance amplifier receives a first signal indicative of the magnitude of the load current conducted by the power transistor and a reference voltage and provides a second signal for controlling the load current. The transconductance amplifier further provides a third signal having a first logical state indicating normal operation and a second logical state indicating an overcurrent condition at the power transistor. The bias current circuit provides an output bias current to the transconductance amplifier in response to the third signal where the output bias current has a nominal current value in normal operation and an increased current value in an overcurrent condition. In this manner, a boost current is provided to the transconductance amplifier to increase the current limit response time when an overcurrent condition is detected.

21 Claims, 5 Drawing Sheets

OVERCURRENT PROTECTION CIRCUIT WITH FAST CURRENT LIMITING CONTROL

FIELD OF THE INVENTION

The invention relates to a circuit for overcurrent protection and, in particular, to a circuit for detecting overcurrent events and providing fast current limiting response to the overcurrent events, such as short circuit events.

DESCRIPTION OF THE RELATED ART

In integrated circuits, overcurrent protection is often included to protect the integrated circuits against excessive loads, such as short circuits at the output load, so as to prevent damage to the integrated circuits. Overcurrent protection can be implemented as a current limiting circuit or an electronic circuit breaker whereby, in response to a rapid increase in load current, the load current is either limited to a certain maximum level or the integrated circuit is shut off entirely.

Overcurrent protection is essential for power transistors that are used in high voltage or high current applications to prevent damages to the power transistors caused by excessive load currents. In the extreme case of an "abrupt short circuit" or "crowbar short circuit," a slow detection and protection response may allow excessive current to flow for extended period of time, causing physical damage to the power transistor output device. Furthermore, slow detection and protection response to an overcurrent event can introduces undesired system issues. For instance, a power transistor is often used to drive a load from an input power supply which is also supplying current to other circuitry within a system. If the load current becomes excessive and current limiting response is not activated fast enough, the supply voltage may dip, causing undesired system issues.

For example, an integrated circuit including a power transistor for driving a load to a supply voltage usually includes supply voltage undervoltage protection. The supply voltage is compared with some minimum allowable reference voltage, often referred to as the undervoltage lock out (UVLO) threshold and if an undervoltage condition is detected, the integrated circuit issues a reset whereby the power transistor is turned off completely. If an overcurrent condition occurs at the load, such as a short-circuit event, so that the output voltage droops rapidly, the supply voltage may also droop in response and fall below the UVLO reference, causing a system reset to be issued. A slow overcurrent detection and protection response will thus result in frequent system resets which are undesirable. This is because certain short circuit condition may be cured quickly and does not require the system to be reset. Furthermore, the integrated circuit's status register may not indicate an overcurrent fault since the integrated circuit was reset due to the undervoltage condition of the supply voltage. Thus, the system is not being alerted of the overcurrent condition and corrective action may not be initiated.

In a power transistor, the slow detection and protection response to an abrupt short circuit condition is usually due to the large gate capacitance (up to 500 pf) of the power transistor and the limited current supplied to the driver circuit driving the power transistor.

SUMMARY OF THE INVENTION

According to one embodiment of the present invention, an overcurrent protection circuit for a power transistor supplying a load current to a load includes a transconductance amplifier and a bias current circuit. The power transistor and the load are connected in series between a first supply voltage and a second supply voltage. The transconductance amplifier has a first input terminal coupled to receive a first signal indicative of the magnitude of the load current conducted by the power transistor, a second input terminal coupled to receive a reference voltage, a first output terminal providing a second signal for driving the control terminal of the power transistor for controlling the load current conducted by the power transistor, and a second output terminal providing a third signal. The third signal has a first logical state when the first signal is less than the reference voltage and a second logical state when the first signal is equal to or greater than the reference voltage where the second logical state indicates an overcurrent condition at the power transistor. The bias current circuit receives an input bias current and provides an output bias current to the transconductance amplifier in response to the third signal. The output bias current has a first current value when the third signal has the first logical state and has a second current value when the third signal has the second logical state, the second current value being larger than the first current value.

In one embodiment, the second current value is at least ten times the first current value. In this manner, a boost current is provided to the transconductance amplifier when an overcurrent condition is detected.

According to another aspect of the present invention, the transconductance amplifier can be implemented as separate circuit elements. Thus, a transconductance stage can be used to provide the second signal while a comparator can be used to provide the third signal.

The present invention is better understood upon consideration of the detailed description below and the accompanying drawings.

DETAILED DESCRIPTION OF THE PREFERRED EMBODIMENTS

In accordance with the principles of the present invention, an overcurrent protection circuit for a power transistor includes a comparator for detecting and indicating an overcurrent condition and a bias current circuit for providing a boost current to a driver circuit driving the power transistor in response to the overcurrent condition. The driver circuit, receiving the boost current, provides fast response in limiting the output current of the power transistor. The overcurrent protection circuit of the present invention operates to provide very fast current limiting response so that damages to the power transistor and undesired system resets are prevented. In general, the overcurrent protection circuit can be applied to any power controlling pass device for providing overcurrent protection where fast current limiting response is critical. The overcurrent protection circuit of the present invention has the advantages of low power consumption and simplified circuitry and thus can be adapted for use in integrated circuits for portable electronic devices.

Figure 1:
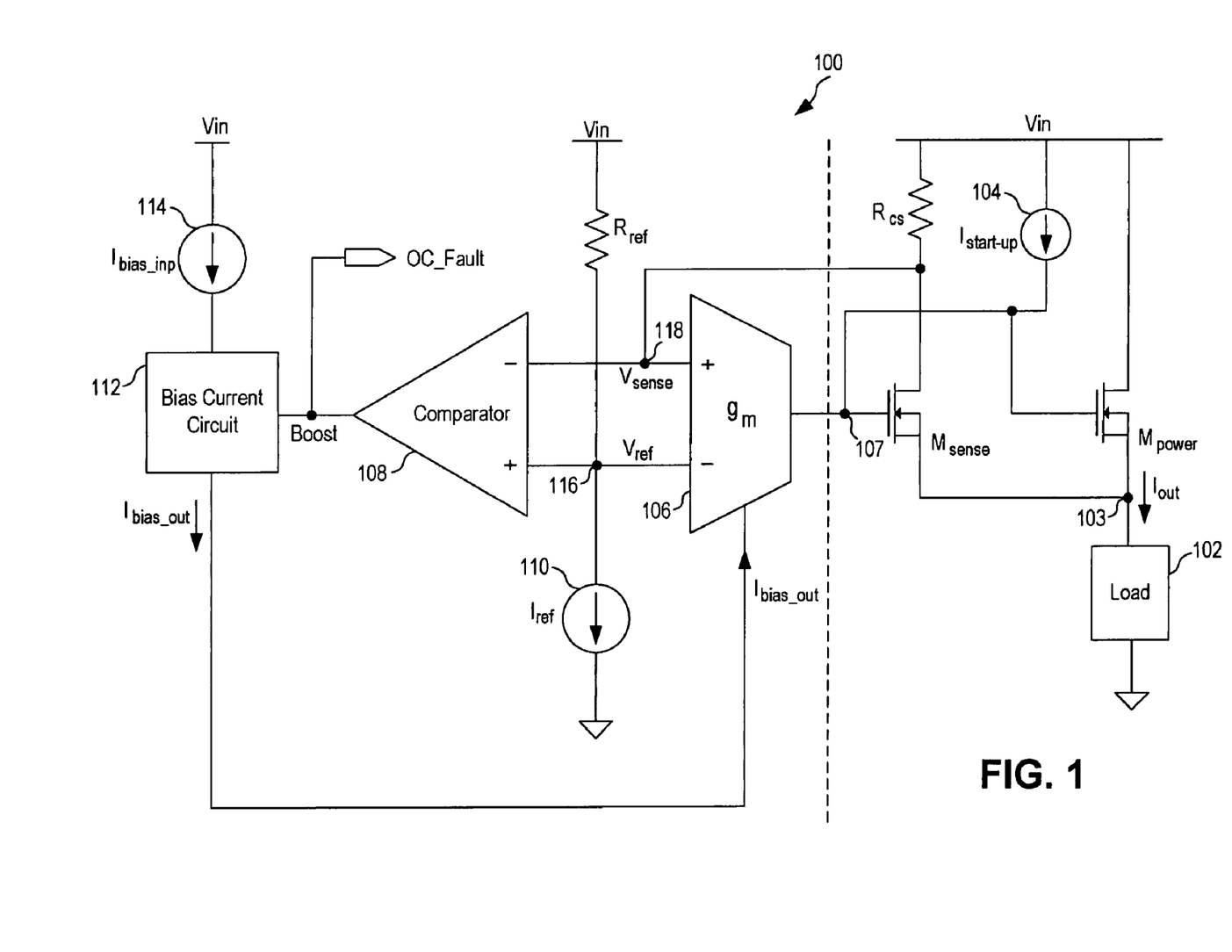
FIG. 1 is a circuit diagram of an overcurrent protection circuit for a power transistor according to one embodiment of the present invention.

FIG. 1 is a circuit diagram of an overcurrent protection circuit for a power transistor according to one embodiment of the present invention. Referring to FIG. 1, a power transistor $M_{power}$, being an N-channel power MOS transistor, has a drain terminal coupled to a positive supply voltage Vin and a source terminal, being the output node 103, coupled to a load 102 and providing an output current $I_{out}$. The gate terminal of power transistor $M_{power}$ is driven by a signal operative to turn the transistor on so as to conduct the output current demanded by the load while sustaining the supply voltage Vin at the load. That is, the voltage at output node 103 is close to the supply voltage Vin. In the present embodiment, the gate terminal of the power transistor $M_{power}$ is driven by a start-up current $I_{start-up}$. In FIG. 1, start-up current $I_{start-up}$ is illustrated as being provided by a current source 104. Start-up current $I_{start-up}$ drives power transistor $M_{power}$ to a gate-to-source voltage (Vgs) so that the drain-to-source "on" resistance (Rds(on)) of the power transistor is at a minimum. In this manner, start-up current $I_{start-up}$ drives power transistor $M_{power}$ to provide the load current demanded by load 102 while maintaining minimum Rds(on) across the power transistor.

In the present embodiment, the gate terminal of power transistor is also driving by a transconductance ($g_m$) stage 106 as part of the overcurrent protection circuit. Transconductance stage 106 operates to modulate the gate-to-source voltage of power transistor $M_{power}$ so as to limit the drain current conducted by the power transistor when necessary. The operation of the transconductance stage 106 in the overcurrent protection circuit of the present invention will be described in more detail below.

The overcurrent protection circuit of the present invention monitors the current flowing through power transistor $M_{power}$ to provide the necessary load current control and limiting response. One of ordinary skill in the art would appreciate that numerous methods for sensing the current through a power transistor are known in the art. In the present embodiment, ratiometric current sensing is employed to sense the output current at the power transistor. In ratiometric current sensing, the current through the power transistor is measured using a sense transistor which matches the power transistor in electrical characteristics but is smaller by a known factor. The current through the sense transistor, which is a known ratio of the current through the power transistor, is measured using a resistor connected in series with the sense transistor. The size of the sense transistor can be made small enough such that the current through the sense transistor is measured with minimal power dissipation. The use of ratiometric current sensing in the present illustration is illustrative only and one of ordinary skill in the art would appreciate that other current sensing techniques can be used as long as the current sensing technique provides a sense signal, typically a voltage value, indicative of the magnitude of the output current. The overcurrent protection circuit of the present invention uses the sense signal to monitor the output current so as to provide current limiting protection.

Referring again to FIG. 1, a sense transistor $M_{sense}$ having a size smaller than power transistor $M_{power}$ and a sense resistor $R_{CS}$ are connected in series between the supply voltage Vin node and the output voltage node 103. Thus, sense resistor $R_{CS}$ and sense transistor $M_{sense}$ are connected in parallel with power transistor $M_{power}$ for sensing the current through the power transistor. Power transistor $M_{power}$ and sense transistor $M_{sense}$ are matching N-channel MOS transistors where sense transistor $M_{sense}$ is chosen to be K times smaller than power transistor $M_{power}$ in order to sense a known fraction of the load current flowing through the power transistor where the load current is the drain current $I_{DS1}$ of power transistor $M_{power}$. Typically, K is in the range of 1000 or more.

The gate terminals of power transistor $M_{power}$ and sense transistor $M_{sense}$ are connected together to node 107 for receiving the start-up current $I_{start-up}$ and the control signal from transconductance stage 106. Meanwhile, the source terminals of both transistors are connected together to output node 103 for driving load 102. Therefore, power transistor $M_{power}$ and sense transistor $M_{sense}$ are driven with identical gate-to-source voltages. Resistor $R_{CS}$ is connected between the supply voltage Vin and the drain terminal of sense transistor $M_{sense}$ and is used to measure the drain current flowing through the sense transistor $M_{sense}$. As long as the voltage across resistor $R_{CS}$ is small compared to the drain-to-source voltage of transistor $M_{sense}$, the drain-to-source voltages across power transistor $M_{power}$ and sense transistor $M_{sense}$ are essentially equal. Since the power transistor and the sense transistor have the essentially same drain-to-source voltages and the same gate-to-source voltages, the drain current $I_{DS2}$ of sense transistor $M_{sense}$ is proportional to and is a fraction of the drain current $I_{DS1}$ of power transistor $M_{power}$. In fact, the drain current of sense transistor $M_{sense}$ is given as: $I_{DS2}=I_{DS1}/K$.

The drain current of sense transistor $M_{sense}$ flows through resistor $R_{CS}$ and a sensed voltage $V_{sense}$ develops across resistor $R_{CS}$. The voltage $V_{sense}$, the difference between supply voltage Vin and the drain voltage of transistor $M_{sense}$, is the product of the drain current $I_{DS2}$ of sense transistor $M_{sense}$ and the resistance of resistor $R_{CS}$. The sensed voltage $V_{sense}$ of sense resistor $R_{CS}$ can be used by the overcurrent protection circuit of the present invention to monitor the current flowing through power transistor $M_{power}$ and load 102.

As mentioned above, in the current sense circuit of FIG. 1, as long as the voltage drop across sense resistor $R_{CS}$ is negligible as compared to the voltage drop across sense transistor $M_{sense}$, the drain-to-source voltages across the power transistor $M_{power}$ and the sense transistor $M_{sense}$ are essentially equal and the current through the sense transistor tracks the current through the power transistor. Through the use of a scaled-down sense transistor, the current sensing operation can be accomplished at a low power dissipation level because the sensed current $I_{DS2}$ is only a fraction of the power transistor's actual current. Furthermore, the ratiometric current sensing technique used herein is applicable when the power transistor is biased either in the saturation region or in the linear (triode) region.

In the present description, a power transistor refers to a power-controlling pass device for providing power switching or power distribution functions. Power transistors are commonly implemented as N-channel MOS transistors, as described above with reference to FIG. 1. However, the power transistor can also be implemented as a P-channel MOS transistor or an N-type or a P-type bipolar transistor. One of ordinary skill in the art would appreciate that the terminal conditions, such as the voltage polarities, of the power transistor can be changed accordingly to accommodate the specific type of power transistor used. Furthermore, one of ordinary skill in the art would appreciate that the transconductance stage can be configured to provide the appropriate control signal to modulate the control voltage of the power transistor. For example, when the power transistor is an MOS device, the control voltage is the gate-to-source voltage of the MOS transistor and the control signal can be a current modulating the gate-to-source voltage of the MOS transistor. When the power transistor is a bipoloar device, the control voltage is the base-to-emitter voltage of the bipolar transistor and the control signal can be a base current driving the base terminal of the bipolar transistor.

In accordance with the present invention, an overcurrent protection circuit 100 is coupled to monitor the load current through power transistor $M_{power}$ and limit the load current to a desired value in the event that an overcurrent condition is detected. In the present embodiment, overcurrent protection circuit 100 includes transconductance ($g_m$) stage 106, a differential comparator 108, a reference resistor $R_{ref}$, a reference current source 110 providing a reference current $I_{ref}$ and a bias current circuit 112. Bias current circuit 112 receives a bias current input $I_{bias\_inp}$ and provides a bias current output $I_{bias\_out}$ for driving transconductance stage 106. As will be explained in more detail below, bias current circuit 112 is operated to provide a boost current to transconductance stage 106 when an overcurrent condition is detected to speed up the response time of the transconductance stage. Overcurrent protection circuit 100 generates a control voltage signal on a lead 107 for driving the gate terminals of sense transistor $M_{sense}$ and power transistor $M_{power}$ for realizing current limiting function.

In overcurrent protection circuit 100, reference resistor $R_{ref}$ and reference current source 110 are connected in series between the supply voltage Vin and the ground voltage. Reference current source 110 provides a reference current $I_{ref}$ which flows through reference resistor $R_{ref}$ and generates a reference voltage $V_{ref}$ across the reference resistor. Reference resistor $R_{ref}$ and sense resistor $R_{CS}$ are either matching resistors having the same resistance values or resistors having ratioed resistance values. Sensed voltage $V_{sense}$ is compared with reference voltage $V_{ref}$ at transconductance stage 106 for generating the control signal on lead 107 to drive the gate terminals of sense transistor $M_{sense}$ and power transistor $M_{power}$. Specifically, the sensed voltage $V_{sense}$ is coupled to the positive input terminal of transconductance stage 106 while the reference voltage $V_{ref}$ is coupled to the negative input terminal of the transconductance stage.

In operation, the reference current $I_{ref}$ is programmable and is selected so as to set the current limit of power transistor $M_{power}$ for overcurrent or short circuit detection. Transconductance stage 106 operates to limit the power transistor's output current (drain current) whenever the sensed voltage $V_{sense}$ at sense resistor $R_{CS}$ is equal to or exceeds the reference voltage $V_{ref}$ generated by reference resistor $R_{ref}$. In normal operation, the sensed voltage $V_{sense}$ should be lower than the reference voltage $V_{ref}$. When a current limit condition is detected, that is, when the sensed voltage $V_{sense}$ increases up to the reference voltage limit, transconductance stage 106 modulates the gate-to-source voltages of power transistor $M_{power}$ and sense transistor $M_{sense}$ to limit the current through the power and sense transistors to a maximum allowable current value indicated by the reference current $I_{ref}$.

In conventional protection circuits, the bias current supplying the transconductance stage is a fixed current and the transconductance stage provides a comparatively slow response due to the large gate capacitance of the power transistor. Increasing the fixed bias current to a large value in order to speed up the transconductance stage is not practical as the power consumption of the circuit is undesirably increased. In accordance with the present invention, overcurrent protection circuit 100 generates a variable bias current for supplying transconductance stage 106 so that fast current limiting response can be achieved without appreciable increase in power dissipation of the circuit. Specifically, a boost current, larger than the steady state bias current value, is supplied to the transconductance stage only when an overcurrent condition at the power transistor is detected. Because the boost current is provided only during an overcurrent event and a smaller bias current is used in normal operation, the response speed of the transconductance stage can be increased without significant increase in the overall power consumption of the protection circuit. Therefore, the overcurrent protection circuit of the present invention can provide fast current limiting response with low power dissipation.

In circuit 100, comparator 108 is coupled to compare sensed voltage $V_{sense}$ and reference voltage $V_{ref}$ which are voltages with respect to the supply voltage Vin. Sensed voltage $V_{sense}$ is coupled to the negative input terminal of comparator 108 while reference voltage $V_{ref}$ is coupled to the positive input terminal of the comparator. Comparator 108 generates a boost signal as the output signal which boost signal is used to control bias current circuit 112. When the sensed voltage $V_{sense}$ is less than the reference voltage $V_{ref}$ to indicate that power transistor $M_{power}$ is operating normally, the boost signal is deasserted. On the other hand, When the sensed voltage $V_{sense}$ is equal to or greater than the reference voltage $V_{ref}$ to indicate an overcurrent condition at power transistor $M_{power}$, the boost signal is asserted. In this manner, comparator 108 operates to detect an overcurrent condition and instruct the bias current circuit to increase the bias current supplied to the transconductance stage.

Bias current circuit 112 receives bias current input $I_{bias\_inp}$, denoted by a current source 114, and generates bias current output $I_{bias\_out}$ having one of two values depending on the state of the boost signal. When the boost signal is deasserted to indicate that power transistor $M_{power}$ is in normal operation, bias current circuit 112 provides current $I_{bias\_out}$ having a first value being a normal current $I_{norm}$. When the boost signal is asserted to indicate an overcurrent condition at power transistor $M_{power}$, bias current 112 provides current $I_{bias\_out}$ having a second value being a boost current $I_{boost}$ greater than current $I_{norm}$. Specifically, the relationship between the normal current and the boost current is given as: $I_{boost}/I_{norm}=M$, where M can be about 10 or greater. In this manner, depending on the state of the boost signal, a normal current value or a boost current value is provided to transconductance stage 106 so that the operational speed of the transconductance stage can be increased as needed to provide a fast current limiting response. Note that there are some practical limits on the value of the boost current in order to keep the active transistors in the transconductance stage above saturation during the boost mode.

In overcurrent protection circuit 100 of the present invention, the bias current for comparator 108 can also be supplied by bias current circuit 112. The comparator 108 can receive a bias current having the normal current value or the comparator can receive the same variable bias current as the transconductance stage. The specific nature of the bias current used to supply comparator 108 is not critical to the practice of the present invention. Besides being used to control bias current circuit 112, the boost signal provided by comparator 108 can be coupled outside of the overcurrent protection circuit to be used as a fault indicator signal to indicate that an overcurrent condition is detected.

Figure 2:
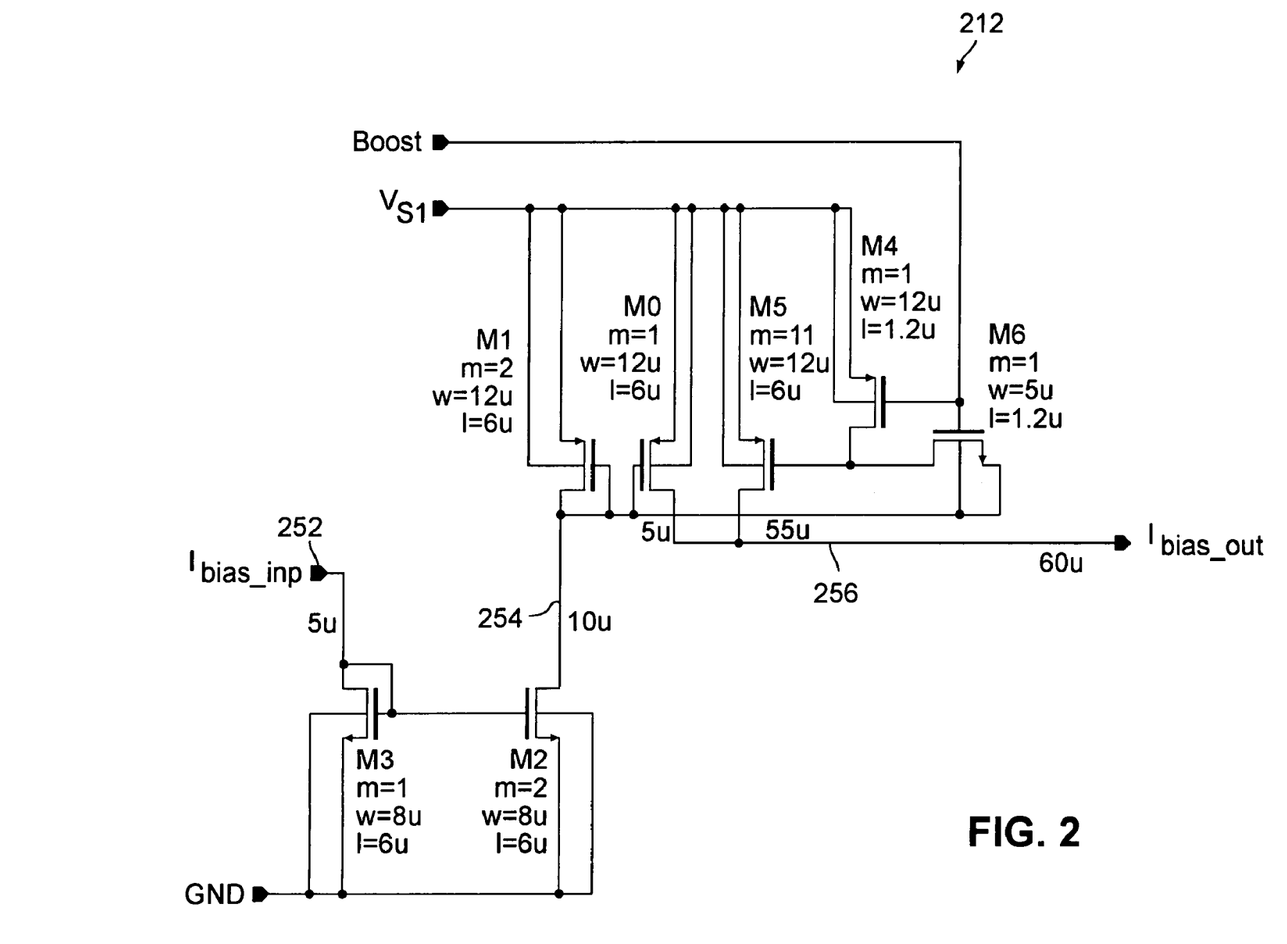
FIG. 2 is a circuit diagram of a bias current circuit which can be incorporated in the overcurrent protection circuit of FIG. 1 according to one embodiment of the present invention.

In one embodiment, bias current circuit 112 is configured as a current mirror for mirroring the bias current input $I_{bias\_inp}$ to generate bias current output $I_{bias\_out}$. FIG. 2 is a circuit diagram of a bias current circuit which can be incorporated in the overcurrent protection circuit of FIG. 1 according to one embodiment of the present invention. Bias current circuit 212 of FIG. 2 is illustrative only and is not intended to be limiting. One of ordinary skill in the art would appreciate that the bias current circuit can be implemented using other circuit configurations known in the art for receiving an input current and generating an output current having one of two current values in accordance with a control signal.

Referring to FIG. 2, NMOS transistors M3 and M2 form a current mirror where the bias current input $I_{bias\_inp}$ at the input node 252 is reflected to node 254. In the present embodiment, transistor M2 is twice the size of transistor M3 and the bias current input $I_{bias\_inp}$ is therefore doubled at node 254. PMOS transistors M1 and M0 form a second current mirror to reflect the current at node 254 to provide the bias current output $I_{bias\_out}$ at output node 256 having the first current value $I_{norm}$. In the present embodiment, transistor M0 is half the size of transistor M1, therefore, the current $I_{norm}$ provided by transistor M0 is one-half of the current at node 254. Thus, in the present embodiment, current $I_{norm}$ equals current $I_{bias\_inp}$.

PMOS transistor M5 with PMOS transistor M1 forms a third current mirror to provide an additional bias current to bias current output $I_{bias\_out}$ when instructed. When transistor M5 is activated to turn on the third current mirror, bias current output $I_{bias\_out}$ at node 256 has a current value $I_{boost}$ which is M times current $I_{norm}$ provided by the second current mirror. In the present embodiment, transistor M5 is 11 times the size of transistor M0. Therefore, the additional current provided by the third current mirror is 11 times current $I_{norm}$. Current $I_{boost}$ is the sum of the current from transistors M0 and M5 and is therefore 12 times current $I_{norm}$. For example, if bias current input $I_{bias\_inp}$ is 5 µA, current $I_{norm}$ is also 5 µA and current $I_{boost}$ is 12*5 µA=60 µA.

The gate terminal of transistor M5 is switchably connected to node 254 through NMOS transistor M6 and is also switchably connected to a positive power supply voltage $V_{S1}$ through PMOS transistor M4. Voltage $V_{S1}$ can be the supply voltage Vin or any other auxiliary positive power supply voltage. Transistor M6 is turned on when the boost signal is asserted to connect the gate terminal of transistor M5 to node 254 to activate the current mirror. Transistor M4, on the other hand, is turned on when the boost signal is deasserted to connect the gate terminal of transistor M5 to the positive power supply voltage $V_{S1}$ so that PMOS transistor M5 is turned off and the third current mirror is deactivated. In this manner, the third current mirror of transistor M5 is controlled by the boost signal to provide the additional boost current when instructed.

In the embodiment of overcurrent protection circuit 100 shown in FIG. 1, the transconductance stage used to drive the gate terminals of the power transistor and the sense transistor and the comparator used to detect and signal overcurrent events are shown as separate circuit elements. While separate circuit elements can be used to implement transconductance stage 106 and comparator 108, the transconductance stage and the comparator can also be implemented as a single integrated circuit element. Thus, according to an alternate embodiment of the present invention, the comparator is integrated with the transconductance stage so that few additional circuit components are needed to implement the comparator function. The overcurrent protection circuit can thus be constructed using simplified and minimal circuitry.

Figure 3:
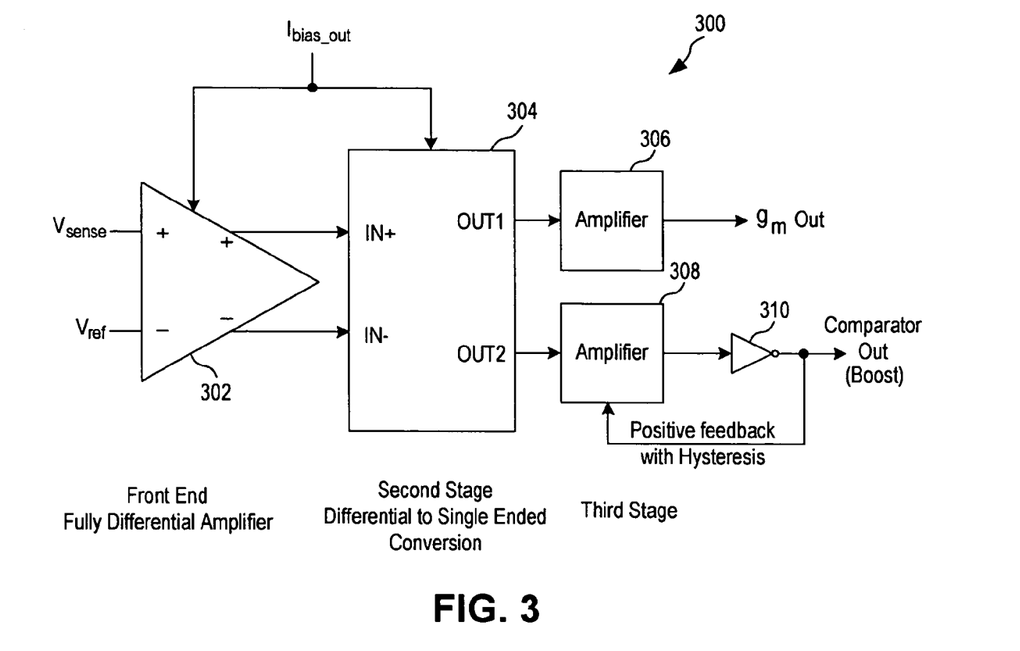
FIG. 3 is a schematic diagram of a transconductance amplifier incorporating the comparator function of the overcurrent protection circuit according to one embodiment of the present invention.

FIG. 3 is a schematic diagram of a transconductance amplifier incorporating the comparator function of the overcurrent protection circuit according to one embodiment of the present invention. Referring to FIG. 3, transconductance amplifier 300 (or transconductance stage 300) includes a fully differential amplifier 302 as the front end input stage and a differential to single-ended conversion circuit 304 as the second stage. Differential amplifier 302 receives the sensed voltage $V_{sense}$ and the reference voltage $V_{ref}$ as input signals and generates differential output signals indicative of the difference between the two input signals. The differential output signals of amplifier 302 are coupled to differential to single-ended conversion circuit 304 as the IN+ and IN− input signals. Differential to single-ended conversion circuit 304 converts the differential input signals IN+ and IN− into a single-ended output signal indicative of the difference between the sensed voltage $V_{sense}$ and the reference voltage $V_{ref}$. In the present embodiment, two versions of the output signal, signals OUT1 and OUT2, are generated by circuit 304 to use as the transconductance stage output and the comparator output. Therefore, signals OUT1 and OUT2 are merely two versions of the same signal.

In transconductance amplifier 300, fully differential amplifier 302 and differential to single-ended conversion circuit 304 are supplied by bias current $I_{bias\_out}$. Thus, amplifier 302 and conversion circuit 304 are biased by a boost current when an overcurrent condition is detected where the boost current operates to increase the response time of amplifier 300. In the present embodiment, only amplifier 302 and conversion circuit 304 receive the variable bias current $I_{bias\_out}$ and amplifiers 306 and 308 can be supplied by a fixed bias current. In other embodiments, amplifiers 306 and 308 can also be biased by bias current $I_{bias\_out}$.

Transconductance amplifier 300 further includes amplifier 306 and amplifier 308 as the third stage amplifiers. Amplifier 306 completes the transconductance amplification function of transconductance amplifier 300. Amplifier 306 is coupled to receive the OUT1 signal from conversion circuit 304 and provides the transconductance amplifier output signal $g_m$ Out. The gm Out signal is the signal on node 107 (FIG. 1) used to drive the gate terminals of the power transistor $M_{power}$ and the sense transistor $M_{sense}$. On the other hand, amplifier 308 and an inverter 310 form the back end stage of the comparator function. Amplifier 308 is coupled to receive the OUT2 signal from conversion circuit 304. The output signal of amplifier 308 is coupled to inverter 310. The output signal of inverter 310 is the comparator output signal (the boost signal). The output signal of inverter 310 is coupled to drive amplifier 308 in a positive feedback loop with hysteresis. The positive feedback operates to speed up the rise time of the comparator output signal so that the boost signal can be asserted quickly in an overcurrent event. The feedback loop includes hysteresis to avoid toggling the boost signal when the sensed voltage $V_{sense}$ or reference voltage $V_{ref}$ drifts within a close range of each other.

When an integrated transconductance amplifier and comparator circuit of FIG. 3 is used, the boost current not only speeds up the transconductance stage but also the rising edge of the comparator output signal since the comparator and the transconductance stage share a common input stage.

Returning to FIG. 1, the overall operation of overcurrent protection circuit 100 will now be described. The description below applies to the circuit configuration of FIG. 1 where transconductance stage 106 and comparator 108 are separate circuit elements and also applies to the circuit configuration where the transconductance amplifier of FIG. 3 is used to implement both the transconductance amplification function and the comparator function.

Under normal operation, start up current $I_{start-up}$ from current source 104 drives the gate terminals of power transistor $M_{power}$ and sense transistor $M_{sense}$. Start up current $I_{start-up}$ drives the power transistor to a gate-to-source voltage to ensure minimum Rds(ON), that is, minimum drain-to-source on resistance at the power transistor. Sense transistor $M_{sense}$ and sense resistor $R_{CS}$ operate to sense a fraction of the load current flowing through power transistor $M_{power}$. The sensed voltage $V_{sense}$ of resistor $R_{CS}$ is compared with the reference voltage $V_{ref}$ where the reference voltage establishes the upper current limit of the power transistor. At transconductance stage 106, sensed voltage $V_{sense}$ is compared with reference voltage $V_{ref}$ to generate the control voltage signal on lead 107 to drive power transistor $M_{power}$ and sense transistor $M_{sense}$ as needed to limit the current provided to load 102. At comparator 108, sensed voltage $V_{sense}$ is compared with reference voltage $V_{ref}$ to signal an overcurrent event where the boost current should be provided.

Thus, as long as sensed voltage $V_{sense}$ is smaller than reference voltage $V_{ref}$, the output impedance of transconductance stage 106 is high and transconductance stage 106 does not perturb the conductivity of the power transistor established by the start-up current $I_{start-up}$. When sensed voltage $V_{sense}$ approaches reference voltage $V_{ref}$, the transconductance stage provides an output current on node 107 for driving the gate terminals of the power and sense transistors to lower the gate-to-source voltage Vgs of the transistors. Thus, the conductance of the power transistor is decreased and the load current provided by the power transistor decreases accordingly. In normal operation, the transconductance stage does not require very fast response and a small bias current can be used to supply the transconductance stage. Thus, in normal operation where voltage $V_{sense}$ is less than voltage $V_{ref}$, the boost signal from comparator 108 is deasserted and bias current circuit provides current $I_{norm}$ as the bias current $I_{bias\_out}$.

However, when the load impedance decreases sharply, such as due to a short-circuit condition at the load, the load current increases rapidly and the transconductance stage must then respond quickly to limit the output current at the power transistor so that the operating current limit is not exceeded. In accordance with the present invention, the comparator operates as a "$g_m$ booster" for speeding up the current limit response time of the transconductance stage. Specifically, when the load current increases rapidly, the sensed voltage $V_{sense}$ increases rapidly to exceed the reference voltage $V_{ref}$. Comparator 108 detects the rapid increase in the sensed voltage $V_{sense}$ and asserts the boost signal. Upon assertion of the boost signal, bias current circuit 112 provides current $I_{boost}$ as the bias current $I_{bias\_out}$. Current $I_{boost}$ provided to transconductance stage 106 increases the response speed of the transconductance stage. As a result, transconductance stage 106 is able to drive the gate-to-source voltage of the power transistor quickly to limit the current at power transistor $M_{power}$.

In one embodiment, the transconductance stage operates to limit the drain current of the power transistor to a certain safe current value where the safe current value can be significantly larger than the steady state load current value. The integrated circuit in which the power transistor and the overcurrent protection circuit are incorporated may include circuitry to monitor the detection of an overcurrent event and the presence of the larger-than-steady-state load current at the power transistor. The integrated circuit may be configured to shut off the power transistor if the larger-than-steady-state load current flows for a given time duration after initiation of the overcurrent event where the prolonged period of large current may indicate that the overcurrent condition at the load still has not been cured. If the power transistor returns to normal current level within the predefined time period after the overcurrent event, the integrated circuit can then assume that the overcurrent condition has been cured and no system reset is necessary. In this manner, the overcurrent protection circuit of the present invention can be used advantageously to limit the load current during an overcurrent event to prevent damage so that certain time duration can be given to allow the load to recover from the overcurrent condition. Once the output current is limited, the integrated circuit in which the overcurrent protection circuit is incorporated can determine if the power transistor has returned to normal operation within the time duration to decide if the power transistor needs to be turned off. Thus, premature turn-off of the power transistor is avoided and the integrated circuit can be operated with fewer system resets.

Figure 4:
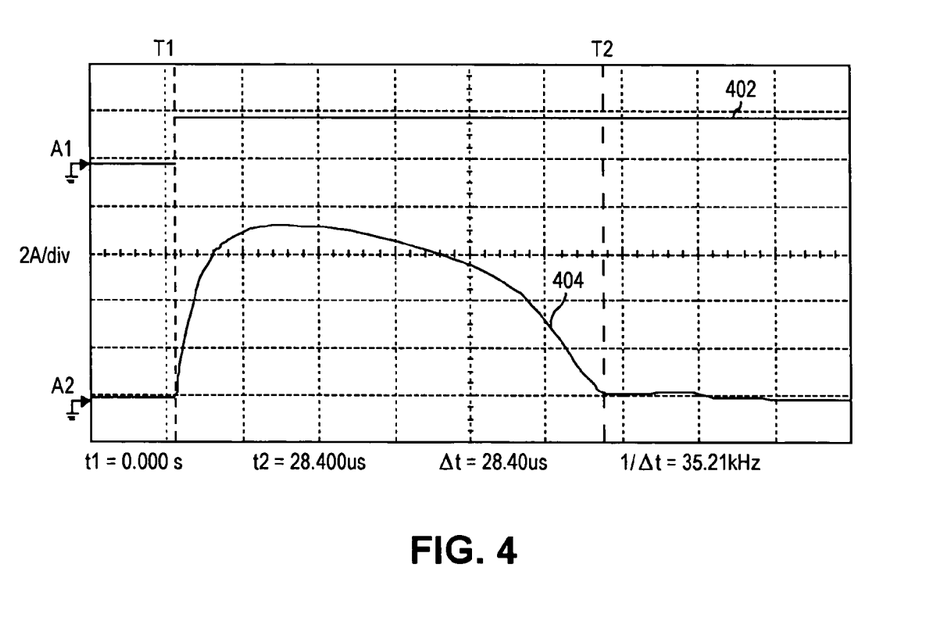
FIG. 4 includes a waveform of the output voltage of a power transistor illustrating the short circuit response obtained using a conventional overcurrent protection circuit.

FIG. 4 includes a waveform of the output voltage of a power transistor illustrating the short circuit response obtained using a conventional overcurrent protection circuit. Curve 402 is a step function illustrating the start of a short circuit condition at time T1 at the load driven by the power transistor. In response to the short circuit, the output current (curve 404) of the power transistor (i.e., the drain current) increases rapidly and the conventional overcurrent protection circuit is initiated to limit the output current. The short circuit current pulse lasts until time T2. The response time of the conventional overcurrent protection circuit is thus 28.4 µs during which time the output current reaches a peak value of 7 A (the vertical scale being 2 A/divisoin). Because the response time of the conventional overcurrent protection circuit is slow, the output current of the power transistor under a short circuit condition is allowed to increase to a very large peak value. In fact, the peak value of the output current is limited only by drain-to-source "on" resistance (Rds(ON)) of the power transistor. The large peak current can potentially cause damage to the power transistor.

Figure 5:
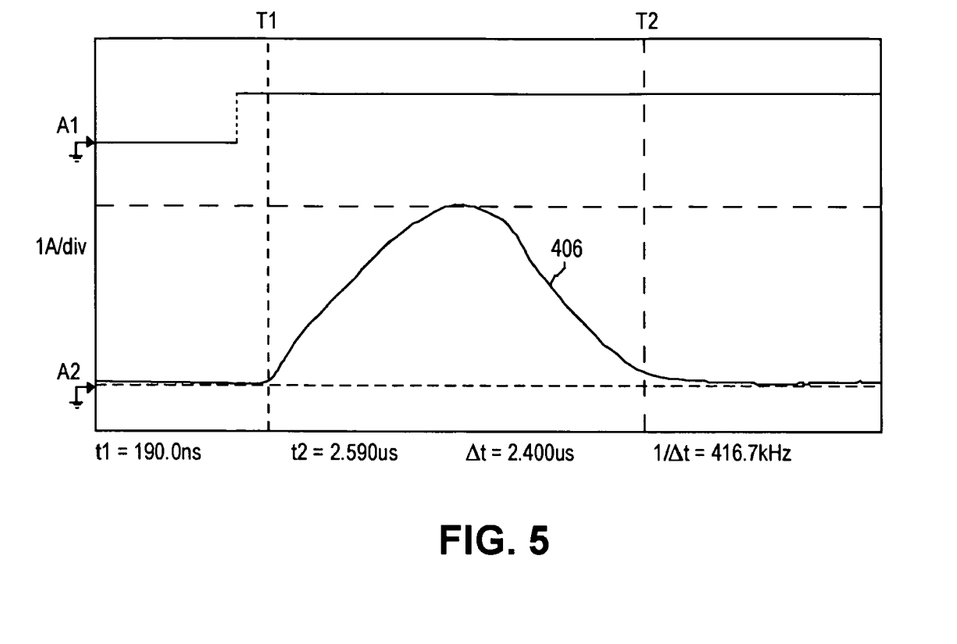
FIG. 5 includes a waveform of the output voltage of a power transistor illustrating the short circuit response obtained using the overcurrent protection circuit of the present invention.

FIG. 5 includes a waveform of the output voltage of a power transistor illustrating the short circuit response obtained using the overcurrent protection circuit of the present invention. In response to a short circuit event, the output current (the drain current) of the power transistor (curve 406) increases rapidly. However, because the overcurrent protection circuit of the present invention provides fast current limiting response, the peak value of the output current reaches only 3.6 A and the short circuit current pulse has a duration of 2.4 µs only (from time T1 to time T2). The short circuit response obtained by using the overcurrent protection circuit of the present invention represents a marked improvement over the conventional protection circuits. First, the peak current value reached by the output current in a short circuit event is only half that of the conventional circuit. Second, the overcurrent protection circuit of the present invention has a response time (or the short circuit current pulse duration) that is 10 times shorter than the conventional circuit. Because the current limiting response time of the overcurrent protection circuit of the present invention is so short, the output current of the power transistor is prevented from reaching a high peak current value to cause damages to the power transistor.

Figure 6:
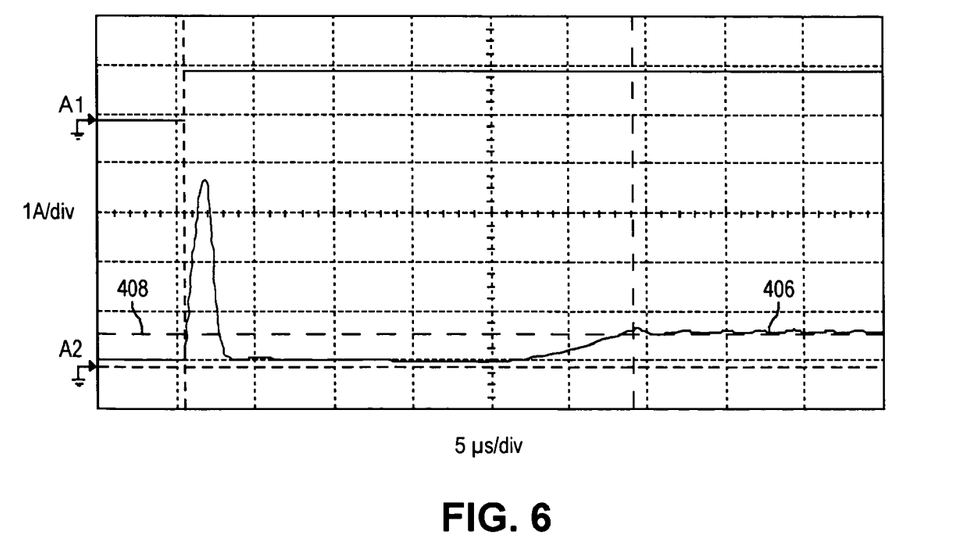
FIG. 6 includes the same output voltage waveform as in FIG. 4 but with an extended time scale to illustrate the current limiting operation of the overcurrent protection circuit of the present invention.

FIG. 6 includes the same output voltage waveform as in FIG. 4 but with an extended time scale to illustrate the current limiting operation of the overcurrent protection circuit of the present invention. As shown in FIG. 6, in response to a short circuit event at the load, the output current (the drain current) of the power transistor increases rapidly (curve 406). However, the overcurrent protection circuit is initiated and responds quickly to limit the output current to a safe current level as represented by line 408. The safe current level can be much larger than the steady state load current in normal operation. Within 2.4 µs, the overcurrent protection circuit has operated to reduce the output current to a very low value. At that point, the overcurrent protection circuit allows the load to draw as much current as it needs until the safe current level limit is reached. In FIG. 6, the output current (curve 406) of the power transistor, having been reduced to a low current value, can be observed to increase back up to the safe current level over time. As discussed above, if the output current remains at the safe current level for a given time duration, the integrated circuit in which the power transistor and the overcurrent protection circuit are incorporated can decide to shut off the power transistor to initiate a reset. If the output current does not remain at the safe current level but rather returns to a nominal value, then the integrated circuit can assume that the short circuit condition has been cured and the power transistor can return to normal operation.

Figure 7:
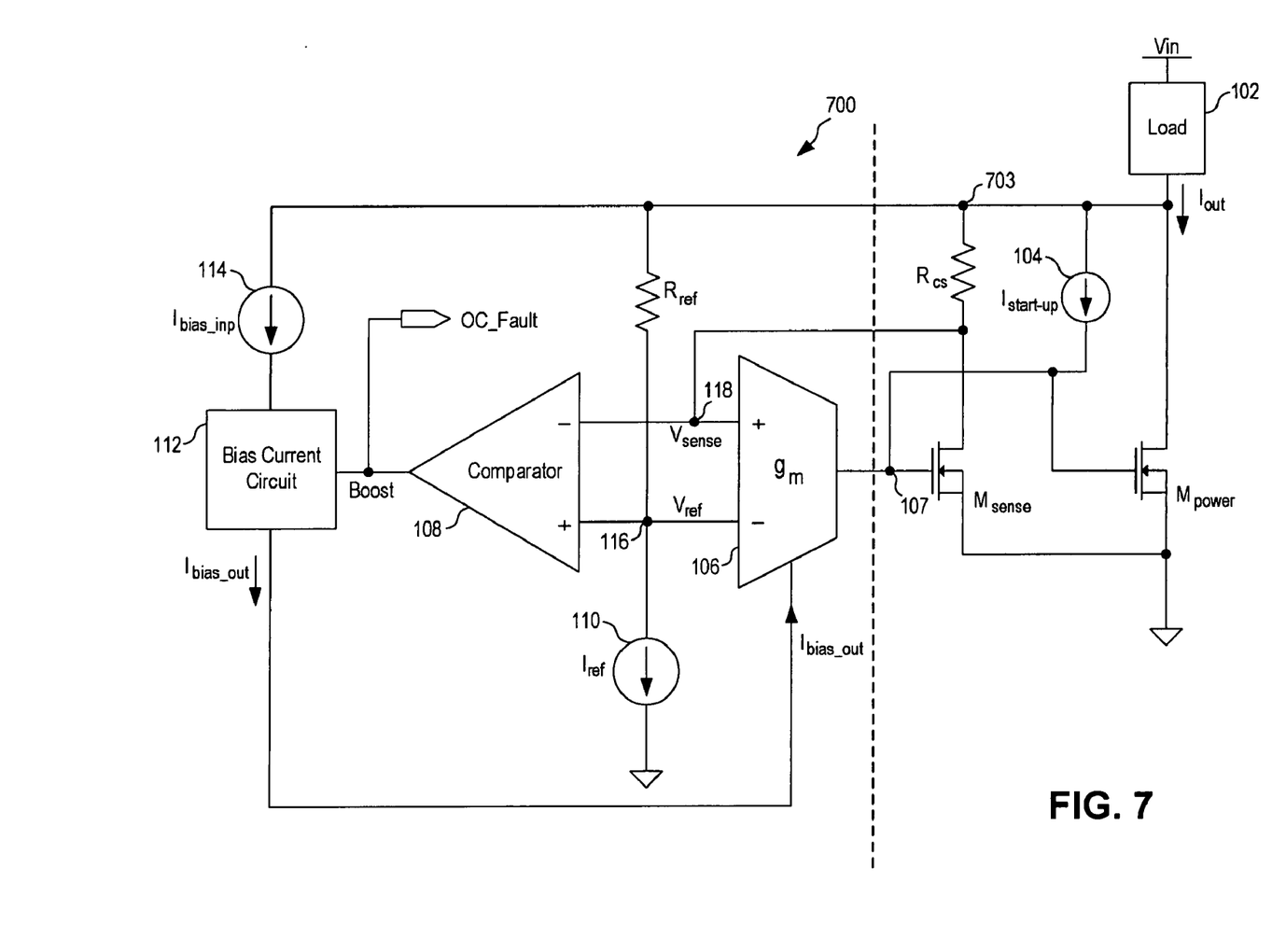
FIG. 7 is a circuit diagram of an overcurrent protection circuit for a power transistor according to an alternate embodiment of the present invention.

In the embodiment shown in FIG. 1, the load is coupled to the source terminal of N-channel power transistor $M_{power}$. The load configuration shown in FIG. 1 is illustrative only and is not intended to limit the present invention to this particular load configuration. One of ordinary skill in the art would appreciate that the overcurrent protection circuit of the present invention can be used with other load configurations of the power transistors, such as coupling the load to the drain terminal of an N-channel power transistor, as shown in FIG. 7 and described below. The placement of the load relative to power transistor $M_{power}$ is not critical to practice of the overcurrent protection circuit of the present invention. In general, the load and the power transistor are connected in series between a first supply voltage, such as a positive supply voltage Vin, and a second supply voltage, such as the ground voltage. The order of placement of the serially connected load and power transistor between the first supply voltage and the second supply voltage can be varied.

FIG. 7 is a circuit diagram of an overcurrent protection circuit for a power transistor according to an alternate embodiment of the present invention. FIG. 7 illustrates an N-channel MOS transistor as the power transistor with the load connected to the drain terminal of the power transistor. Referring to FIG. 7, a load 102 and N-channel MOS power transistor $M_{power}$ are connected in series between the supply voltage Vin and the ground voltage. Specifically, load 102 is connected between voltage Vin and a node 703 while power transistor $M_{power}$ is connected between node 703 and the ground node. Power transistor $M_{power}$ provides output current $I_{out}$ as the drain current.

In the load configuration shown in FIG. 7, the circuit elements making up the start-up current, the current sensing circuit, and the overcurrent protection circuit 700 are powered off node 703. For example, sense resistor $R_{CS}$ and sense transistor $M_{sense}$ are connected in series between node 703 and the ground node. Similarly, Reference resistor $R_{ref}$ and reference current source 110 are connected in series between node 703 and the ground node.

The operation of the overcurrent protection circuit of the present invention is the same regardless of the load configuration used for the power transistor. Thus, comparator 108 of overcurrent protection circuit 700 monitors the output current $I_{out}$ flowing through load 102 and power transistor $M_{power}$ through sensed voltage $V_{sense}$. When an overcurrent condition is detected, bias current circuit 112 is operated to provide a boost current to transconductance stage 106 to speed up the response time of the transconductance stage. In this manner, overcurrent protection circuit 700 operates effectively to provide fast overcurrent protection for power transistor $M_{power}$.

The above detailed descriptions are provided to illustrate specific embodiments of the present invention and are not intended to be limiting. Numerous modifications and variations within the scope of the present invention are possible. For example, one of ordinary skill in the art would appreciate that the power transistor and the sense transistor can be implemented as P-channel transistors and such a person of ordinary skill would know how to modify the terminal conditions when p-channel transistors are used. Similarly, one of ordinary skill in the art would appreciate that the power transistor and the sense transistor can be implemented as N-type or P-type bipolar transistors and such a person of ordinary skill would know how to modify the terminal conditions when bipolar transistors are used. Furthermore, the sense resistor and the reference resistor can be fabricated in numerous ways as long as matching resistors are produced. The present invention is defined by the appended claims.

We claim:

1. An overcurrent protection circuit for a power transistor supplying a load current to a load, the power transistor and the load being connected in series between a first supply voltage and a second supply voltage, the overcurrent protection circuit comprising:

a transconductance amplifier having a first input terminal coupled to receive a first signal indicative of the magnitude of the load current conducted by the power transistor, a second input terminal coupled to receive a reference voltage, a first output terminal providing a second signal for driving the control terminal of the power transistor for controlling the load current conducted by the power transistor, and a second output terminal providing a third signal, the third signal having a first logical state when the first signal is less than the reference voltage and a second logical state when the first signal is equal to or greater than the reference voltage, the second logical state of the third signal indicating an overcurrent condition at the power transistor; and a bias current circuit receiving an input bias current and providing an output bias current to the transconductance amplifier in response to the third signal, the output bias current having a first current value when the third signal has the first logical state and having a second current value when the third signal has the second logical state, the second current value being larger than the first current value.

2. The overcurrent protection circuit of claim 1, wherein the transconductance amplifier comprises:
   a fully differential amplifier receiving the first signal and the reference voltage as input signals and providing first and second differential output signals indicative of the difference between the first signal and the reference voltage;
   a differential to single-ended conversion circuit receiving the first and second differential output signals and providing a first single-ended output signal and a second single-ended output signal, the first single-ended output signal being identical to the second single-ended output signal;
   a first amplifier coupled to receive the first single-ended output signal and providing the second signal as the output signal; and
   a second amplifier and an inverter connected in series, the second amplifier coupled to receive the second single-ended output signal and provide an amplified output signal to the inverter, the inverter providing the third signal as output signal, the third signal being coupled to drive the second amplifier in a positive feedback loop with hysteresis.

3. The overcurrent protection circuit of claim 1, wherein the second current value is at least ten times the first current value.

4. The overcurrent protection circuit of claim 1, wherein the first signal comprises a voltage signal corresponding to a sensed current where the sensed current is proportional to and a fraction of the load current conducted by the power transistor.

5. The overcurrent protection circuit of claim 1, wherein the reference voltage is provided by passing a reference current through a reference resistor, the reference current being programmable to establish an upper current limit for the power transistor.

6. The overcurrent protection circuit of claim 1, wherein the bias current circuit comprises a first current mirror mirroring the input bias current and providing a current having the first current value, and a second current mirror, controlled by the third signal, mirroring the input bias current and providing a current having a third current value, wherein the second current mirror is turned off when the third signal has the first logical state so that the output bias current has the first current value only and the second current mirror is turned on when the third signal has the second logical state so that the output bias current has the second current value being the sum of the first current value and the third current value.

7. The overcurrent protection circuit of claim 1, wherein the second signal for driving the control terminal of the power transistor comprises a current signal for modulating the control voltage of the power transistor.

8. The overcurrent protection circuit of claim 1, wherein the power transistor comprises an N-channel MOS transistor and the load is coupled to the source terminal of the power transistor.

9. The overcurrent protection circuit of claim 1, wherein the power transistor comprises an N-channel MOS transistor and the load is coupled to the drain terminal of the power transistor.

10. An overcurrent protection circuit for a power transistor supplying a load current to a load, the power transistor and the load being connected in series between a first supply voltage and a second supply voltage, the overcurrent protection circuit comprising:
    a transconductance stage having a first input terminal coupled to receive a first signal indicative of the load current provided by the power transistor, a second input terminal coupled to receive a reference voltage, and an output terminal providing a second signal for driving the control terminal of the power transistor for controlling the load current conducted by the power transistor;
    a comparator having a first input terminal coupled to receive the first signal, a second input terminal coupled to receive the reference voltage, and an output terminal providing a third signal, the third signal having a first logical state when the first signal is less than the reference voltage and a second logical state when the first signal is equal to or greater than the reference voltage, the second logical state of the third signal indicating an overcurrent condition at the power transistor; and
    a bias current circuit receiving an input bias current and providing an output bias current to the transconductance stage in response to the third signal, the output bias current having a first current value when the third signal has the first logical state and having a second current value when the third signal has the second logical state, the second current value being larger than the first current value.

11. The overcurrent protection circuit of claim 10, wherein the second current value is at least ten times the first current value.

12. The overcurrent protection circuit of claim 10, wherein the first signal comprises a voltage signal corresponding to a sensed current where the sensed current is proportional to and a fraction of the load current conducted by the power transistor.

13. The overcurrent protection circuit of claim 10, wherein the reference voltage is provided by passing a reference current through a reference resistor, the reference current being programmable to establish an upper current limit for the power transistor.

14. The overcurrent protection circuit of claim 10, wherein the bias current circuit comprises a first current mirror mirroring the input bias current and providing a current having the first current value, and a second current mirror, controlled by the third signal, mirroring the input bias current and providing a current having a third current value, wherein the second current mirror is turned off when the third signal has the first logical state so that the output bias current has the first current value only and the second current mirror is turned on when the third signal has the second logical state so that the output bias current has the second current value being the sum of the first current value and the third current value.

15. The overcurrent protection circuit of claim 10, wherein the second signal for driving the control terminal of the power transistor comprises a current signal for modulating the control voltage of the power transistor.

16. The overcurrent protection circuit of claim 10, wherein the power transistor comprises an N-channel MOS transistor and the load is coupled to the source terminal of the power transistor.

17. The overcurrent protection circuit of claim 10, wherein the power transistor comprises an N-channel MOS transistor and the load is coupled to the drain terminal of the power transistor.

18. A method for providing overcurrent protection to a power transistor supplying a load current to a load, the power transistor and the load being connected in series between a first supply voltage and a second supply voltage, the method comprising:

sensing the load current conducted by the power transistor;

generating a first signal indicative of the sensed current;

comparing the first signal to a reference voltage;

generating a second signal at a transconductance stage as a result of the comparison, the second signal for driving the control terminal of the power transistor to control the load current conducted by the power transistor;

generating a third signal as a result of the comparison, the third signal having a first logical state when the first signal is less than the reference voltage and a second logical state when the first signal is equal to or greater than the reference voltage, the second logical state of the third signal indicating an overcurrent condition at the power transistor; and providing a bias current to the transconductance stage having a first current value when the third signal has the first logical state and having a second current value when the third signal has the second logical state, the second current value being larger than the first current value.

19. The method of claim 18, wherein the second current value is at least ten times the first current value.

20. The method of claim 18, wherein sensing the load current conducted by the power transistor comprises measuring a fraction of the load current as the sensed current.

21. The method of claim 18, wherein the first signal comprises a voltage signal corresponding to the sensed current.

* * * * *